(12) United States Patent
Wu et al.

(10) Patent No.: US 7,209,354 B2
(45) Date of Patent: Apr. 24, 2007

(54) BALL GRID ARRAY PACKAGE WITH HEAT SINK DEVICE

(75) Inventors: Chung-Ju Wu, Kaohsiung (TW); Wei-Feng Lin, Hsin-Chu (TW)

(73) Assignee: Silicon Intergrated Systems Corp., Hsin chu (TW)

( * ) Notice: Subject to any disclaimer, the term of this patent is extended or adjusted under 35 U.S.C. 154(b) by 187 days.

(21) Appl. No.: 10/724,891

(22) Filed: Dec. 2, 2003

(65) Prior Publication Data

US 2005/0117296 A1    Jun. 2, 2005

(51) Int. Cl.
  *H05K 7/20* (2006.01)
  *H01L 23/36* (2006.01)
  *H05K 1/18* (2006.01)

(52) U.S. Cl. ............... 361/697; 361/718; 361/719; 257/707; 257/720; 257/706

(58) Field of Classification Search ............ 361/696, 361/697, 701–704, 709, 710, 717–719; 257/705–707, 257/713, 717–719, 720; 439/68, 487
See application file for complete search history.

(56) References Cited

U.S. PATENT DOCUMENTS

| | | | | |
|---|---|---|---|---|
| 5,473,510 A * | 12/1995 | Dozier, II | ............ | 361/719 |
| 5,552,635 A * | 9/1996 | Kim et al. | ............ | 257/706 |
| 5,730,620 A * | 3/1998 | Chan et al. | ............ | 439/526 |
| 5,738,531 A * | 4/1998 | Beaman et al. | ............ | 439/71 |
| 5,770,891 A * | 6/1998 | Frankeny et al. | ............ | 257/727 |
| 5,847,928 A * | 12/1998 | Hinshaw et al. | ............ | 361/704 |
| 5,926,371 A * | 7/1999 | Dolbear | ............ | 361/704 |
| 6,061,235 A * | 5/2000 | Cromwell et al. | ............ | 361/690 |
| 6,154,365 A * | 11/2000 | Pollard et al. | ............ | 361/704 |
| 6,359,783 B1 * | 3/2002 | Noble | ............ | 361/704 |
| 6,395,991 B1 * | 5/2002 | Dockerty et al. | ............ | 174/252 |
| 6,400,577 B1 * | 6/2002 | Goodwin et al. | ............ | 361/816 |
| 6,459,582 B1 * | 10/2002 | Ali et al. | ............ | 361/704 |
| 6,462,951 B2 * | 10/2002 | Letourneau | ............ | 361/704 |
| 6,545,879 B1 * | 4/2003 | Goodwin | ............ | 361/807 |
| 6,596,565 B1 * | 7/2003 | Hembree | ............ | 438/122 |
| 6,657,131 B2 * | 12/2003 | Gonzalez et al. | ............ | 174/260 |
| 6,930,884 B2 * | 8/2005 | Cromwell et al. | ............ | 361/710 |
| 6,936,919 B2 * | 8/2005 | Chuang et al. | ............ | 257/717 |

* cited by examiner

*Primary Examiner*—Anatoly Vortman
(74) *Attorney, Agent, or Firm*—The Nath Law Group; Harold L. Novick

(57) ABSTRACT

The present invention provides a heat sink device for the package device to improve the heat dissipating efficiency. The heat sink device includes a first heat sink assembly and a second heat sink assembly. The first heat sink assembly has a first heat dissipating structure, a second heat dissipating structure positioned above first the heat dissipating structure, at least two thermal supports on the backside of the first heat sink assembly and a thermal block on the backside of the first heat sink assembly. The second heat sink assembly has a protruding structure and at least the openings. The first heat sink assembly is fixed with the second heat sink assembly to form a heat sink device by the combination of the thermal supports and the openings. The first heat sink assembly and the second heat sink assembly are attached to the integrated circuit device separately by the thermal block and the protruding structure. This heat sink device provides several heat dissipating pathes by the second heat dissipating structure, the thermal supports, the thermal block, and protruding structure. Therefore, the heat dissipation efficiency of the heat sink device is improved.

16 Claims, 4 Drawing Sheets

BALL GRID ARRAY PACKAGE WITH HEAT SINK DEVICE

BACKGROUND OF THE INVENTION

1. Field of the Invention

The present invention generally relates to a heat sink applied to an integrated circuit, and more particularly to a package device with a heat sink to reduce the thermal resistance and to improve the efficiency of thermal dissipation.

2. Description of the Prior Art

In the electronics and computer industries, it has been well known to employ various types of electronic package devices and integrated circuit chips, such as the PENTIUM central processing unit chip (CPU) manufactured by Intel Corporation. These integrated circuit chips have a pin grid array (PGA) package and are typically installed into a socket. These integrated circuit chips are installed onto a computer circuit board by soldering. These integrated circuit device for example the CPU microprocessor chips, generate a great deal of heat during operation which must be removed to prevent adverse effects. The PENTIUM microprocessor contain millions of transistors, and they are highly susceptible to overheating. Therefore, the microprocessor device itself or other components proximal to the microprocessor are easy to be destroyed because of overheating.

In addition to the above discussion, there are many other types of semiconductor package devices, which are commonly used in computer equipment. At least some of these semiconductor package devices also have the above-mentioned problem. For example, the resistors and thermistors generate large volumes of heat during normal operation, and if the heat can not be dissipated quickly to cool down the resistors and thermistors they can be destroyed and damaged by the heat.

Also, the solid-state devices are commonly being installed onto a circuit board, or be installed into a motherboard or other similar primary circuit board in turn. For example, microprocessors, such as the PENTIUM II and the Celeron from Intel, are so-called "processor cards" which are installed into a motherboard of a computer in similar fashion to the way a modem is installed into a motherboard. The existing processor card, as known, has the processor semiconductor devices, such cache chips, or the like, and they are necessary for the operation of the card. The processor package may be installed into the processor card via a pin grid, ball grid, and land grid array and with a socket such as a ZIF or ball grid socket.

Similarly, according to the earlier semiconductor devices discussed above, there are many different types of electronic devices which suffer from overheating. For example, any electronic package device may have a threat of overheating, and need to be cooled down to prevent overheating. However, the devices are too small to adequately support and receive the typical metallic heat sink. These prior metallic heat sinks are commonly glued directly to the electronic device with a thermally conductive adhesive, or installed into the electronic package device with a mechanical structure, such as a spring clip. Further, gap pads out the interface surface between the package device and the dissipating structure are often required to achieve thermal dissipating efficiency. In view of the foregoing issues related to these types of electronic components, providing heat dissipation in the form of heat sinks, and the like, is difficult and cost prohibitive.

The foregoing heat sink assembly of the prior art suffers from the disadvantages of having multiple components and the high cost associated therewith. These multiple component heat sink assemblies typically include expensive machined or extruded heat conductive metal, such as aluminum. Other parts, such as springs or addition clips require separate machining steps and/or molds for production. Therefore, these assemblies and methods are completely inappropriate for most electronic devices.

FIG. 1 and FIG. 2 illustrate a conventional ball grid array package 100 with heat slug. The ball grid array package device with heat slug includes a ball grid array substrate 102, a chip or die 104 that is located on the ball grid array substrate 102, and a modified heat slug 106 that is positioned over the chip 104 and the ball grid array substrate 102. Then, a molding compound 108 is injected into the ball grid array package device 100 to accomplish the ball grid array packaging process. Referring to FIG. 2, the die or chip 104 is covered by the molding compound 108, and the heat dissipating path is restricted by the low thermal conductivity of the molding compound 108. So the ball grid array package device 100 can not get good heat dissipating efficiency. The solution of this problem is to add an embedded heat slug 108 onto the die or chip 104 to increase the heat dissipating area. Nevertheless, the defect of this technique is that if the die or chip 104 generate a large volume of heat, the heat cannot be removed to the environment sufficiently to reduce the operating temperature of the die or chip 104. Therefore, the chip or die 104 cannot be operated.

SUMMARY OF THE INVENTION

It is an object of this invention is to provide a package device with a heat sink assembly thereon, wherein the heat sink assembly is made by casting to increase the heat dissipating efficiency.

It is another object of this invention is to provide a thermal block on the backside of the first heat sink assembly to associate the cavity of the ball grid array package device with modified embedded heat slug to improve the heat dissipating efficiency.

It is a further object of this invention is to provide at least two thermal supports on the backsides of first heat sink assembly to join the openings of the second heat sink assembly.

It is yet another object of this invention is to provide a second heat sink assembly to join at least two thermal supports of the first heat sink assembly to attach the backside of the printed circuit board to dissipate the heat from the backside of the printed circuit board through the second heat sink assembly to at least two thermal supports of the first heat sink assembly.

According to abovementioned objects, the present invention provides the heat sink device for the ball grid array package device with a modified embedded heat slug to improve the heat dissipating efficiency. The heat sink device is constructed of first heat sink assembly and the second heat sink assembly. The first heat sink assembly includes at least two thermal supports that located under the two sides of the first heat sink assembly, which is used to increase the heat dissipating area. A thermal block located below the backside of the heat sink, and the thermal block associated with the cavity of the ball grid array package device with modified embedded heat slug to increase the heat dissipating efficiency. In addition, the second heat sink assembly is a bottom plate, which includes a protruding structure in the center of the second heat sink assembly, and at least two openings on the two sides of the second heat sink assembly respectively. The protruding structure attached to the backside of the printed circuit board to increase the efficiency of heat dissipation and to remove the heat that is generated from the die or chip. In addition, at least two openings of the second heat sink assembly accommodate at least two thermal supports of the first heat sink assembly to fix the first heat sink assembly, the second heat sink assembly, and the ball grid array package device, in which the ball grid array package device positioned between the first heat sink assembly and the second heat sink assembly.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
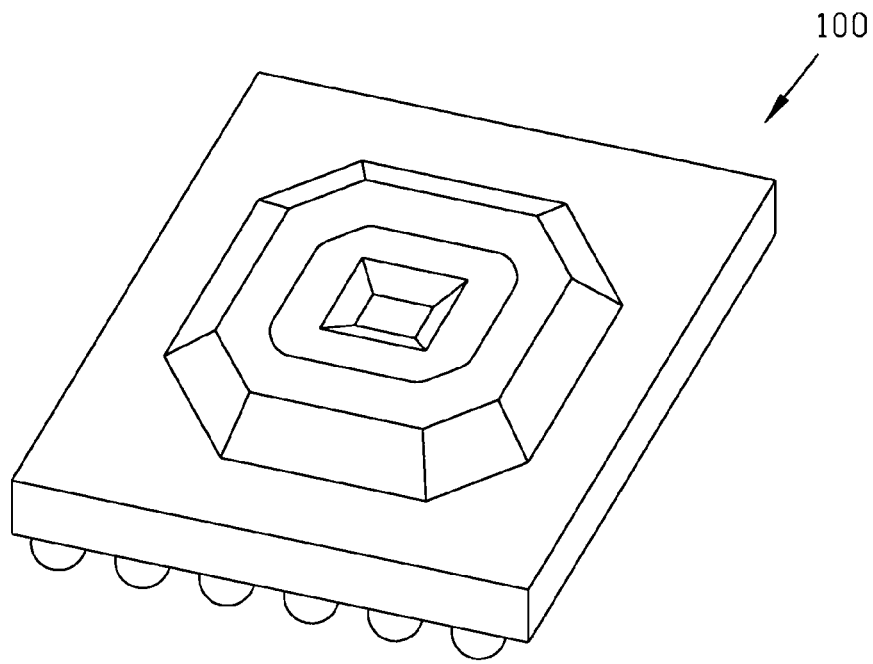
FIG. 1 is a schematic that shows the lateral view of device of the ball grid array package device with the modified embedded heat slug in accordance with the prior conventional technique.
Figure 2:
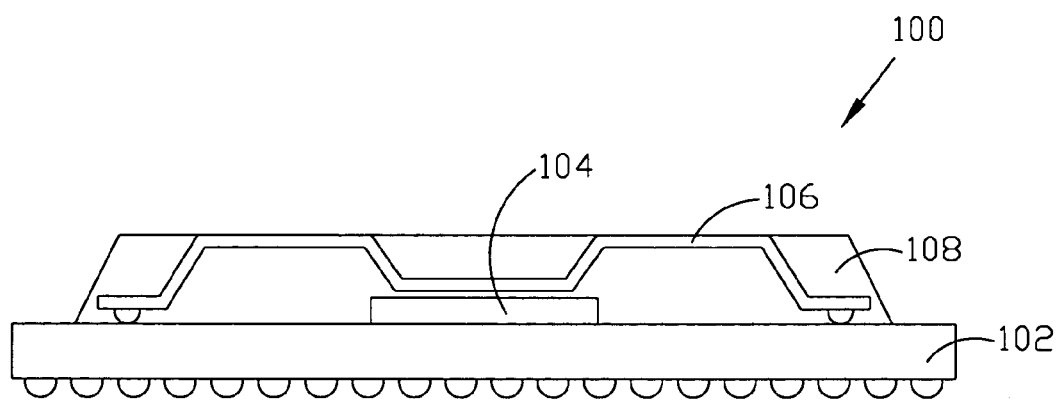
FIG. 2 is a schematic representation the cross-section view of device of the ball grid array package with modified embedded heat slug in accordance with the prior conventional technique.
Figure 3:
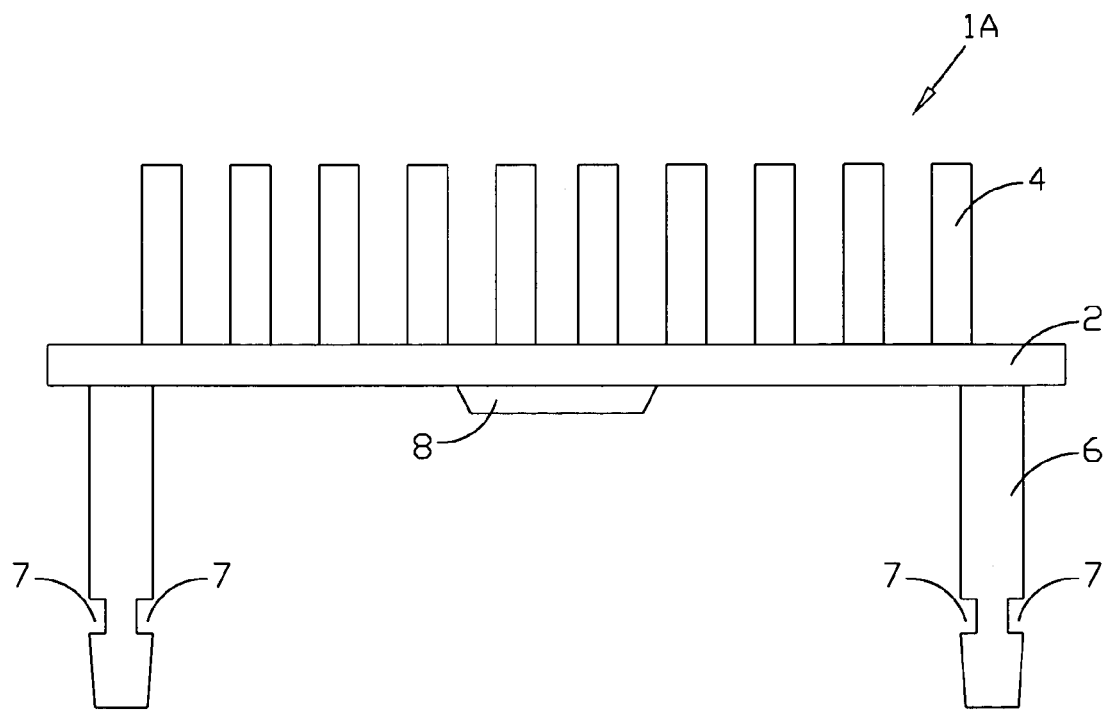
FIG. 3 is a schematic that shows the cross-sectional view of the structure of a first heat sink assembly that includes a first heat sink structure thereon, at least two thermal supports located under two sides of the heat sink body, and a thermal block that located on the backside of the first heat sink structure in accordance with the device disclosed herein.
Figure 4:
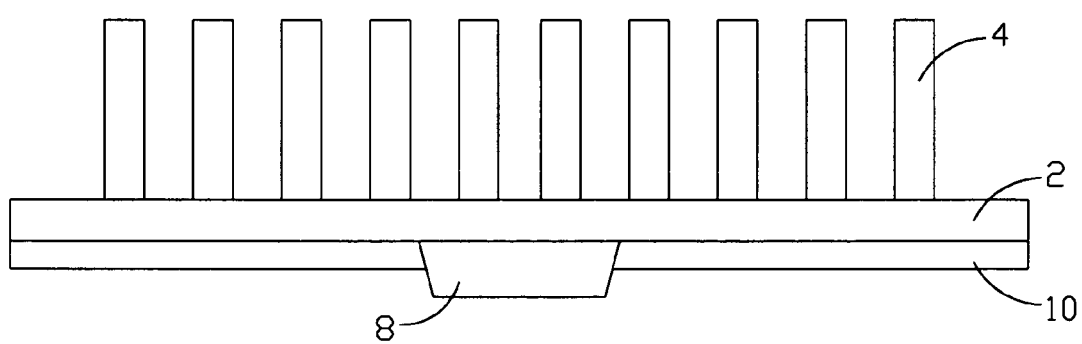
FIG. 4 is a schematic that shows the cross-sectional view of the thermal conductive adhesive tape spread overall the surface of backside of the first heat sink structure to fix and to increase the heat dissipating efficiency in accordance with the device disclosed herein.
Figure 5:
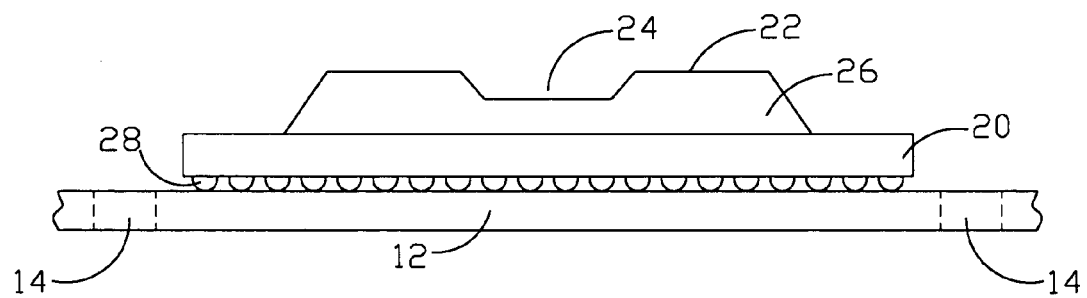
FIG. 5 is a schematic that shows the cross-sectional view of the structure of the ball grid array package device with modified embedded heat slug on the printed circuit board in accordance with the device disclosed herein.

The present invention provides the package device with modified embedded heat slug to reduce the thermal resistance and to increase the heat dissipating capability. The package device can be a ball grid array package device. FIG. 3 through FIG. 7 illustrates the structure, function, and the relationship there-between of the heat sink device, and FIG. 8 represents the heat-dissipating path of the heat sink device of the present invention. FIG. 3 represents the structure of the first heat sink assembly 1A, which includes a first heat dissipating structure 2 and a second heat dissipating structure 4. The second heat dissipating structure 4, such as a heat dissipating fin, is disposed on the first heat dissipating structure 2. The second heat dissipating structure 4 is used to increase the heat dissipating area to improve the heat dissipating efficiency. At least two thermal supports 6 are located on the backside of the first heat dissipating structure 2, and are insertable through holes 14 in a printed circuit board 12 (as shown in FIG. 8). The first heat dissipating structure 2 is attached to the package device with a modified embedded heat slug on the printed circuit board (as shown in FIG. 5), and is connected with the second the heat sink assembly (as shown in FIG. 4).

The key feature of the present invention is that the first heat dissipating structure 2 is made of conductive material such as metal, and is made by casting, therefore, the heat dissipating efficiency would be improved. Another key feature of the present invention is that at least two thermal supports 6 located on the backside of the first heat dissipating structure 2 are used instead of the conventional plastic supports to increase the heat dissipating efficiency.

Referring to FIG. 3, the first heat dissipating structure 2 further includes a thermal block 8 on the backside of first heat dissipating structure 2. The thermal block 8 contacts with the walls defining cavity 24 of the package device with modified embedded heat slug to increase the heat dissipating efficiency. When a large quantity of heat is generated during the operation of the integrated circuit, the thermal block 8 helps to dissipate the heat. In an alternative preferred embodiment, the thermal conductive adhesive tape 10 is spread overall the surface of backside of the first heat dissipating structure 2 (as shown in FIG. 4). The thermal conductive adhesive tape 10 is connected with the surface of the molding compound 26 of the package device to increase the heat dissipation efficiency.

FIG. 4 shows another alternative embodiment of the present invention. The thermal conductive adhesive tape 10 is located on the backside of the first heat dissipating structure 2 in which the thermal conductive adhesive tape 10 is spread around the backside of the first heat dissipating structure 2, except the thermal block 8. The thermal block 8 on the backside of the first heat dissipating structure 2 can be an inseparable member into the first heat dissipating structure 2, or added on the backside of the first heat dissipating structure 2.

FIG. 5 illustrates the structure of the package device with modified embedded heat slug on the printed circuit board. The structure includes a ball grid array package substrate 20 and a modified embedded heat slug 22. The modified embedded heat slug 22 is located on the ball grid array package substrate 20, and the modified embedded heat slug 22 has a cavity 24 therein in order to reduce the thickness of the molding compound 26. In addition, the plurality of balls 28 are located under the ball grid array package substrate 20 the connect with the printed circuit board 12. Furthermore, the printed circuit board 12 includes at least two holes 14 therein to permit at least two thermal supports 6 to pass through.

In another embodiment, the first heat dissipating structure 2 does not have any thermal support 6, and the printed circuit board 12 does not have any holes 14 therein. Only the thermal block 8 assembles with the cavity 24 of the heat slug. Furthermore, a conductive material can be used as an adhesive material to adhere the first heat dissipating structure 2 and the ball grid array package device 22.

Figure 6:
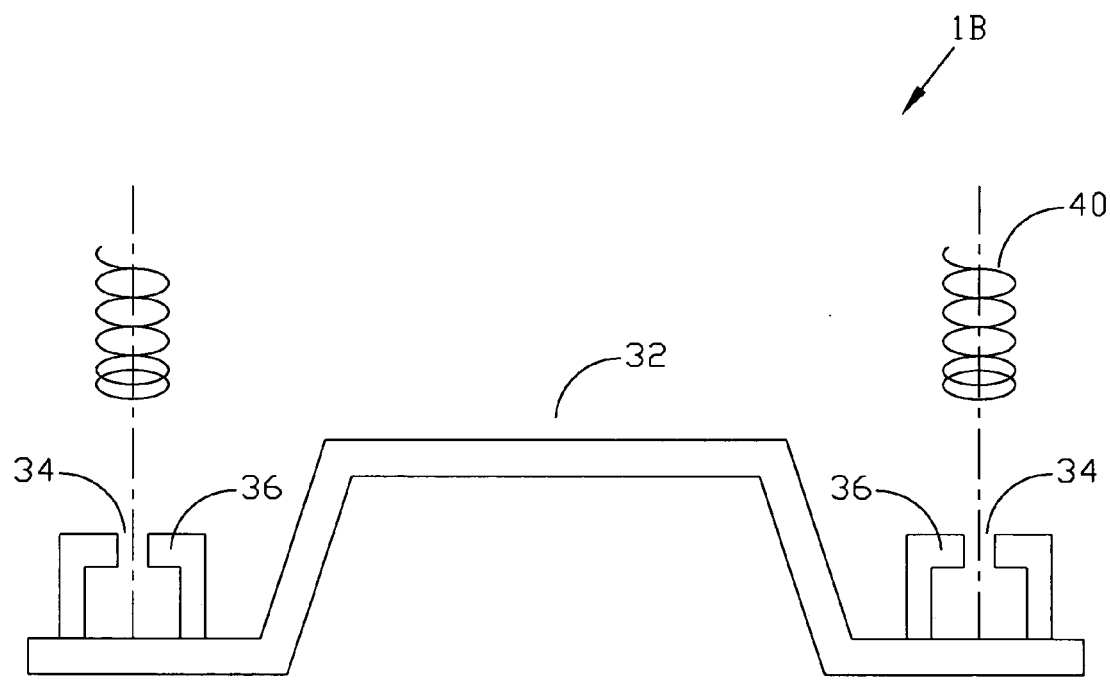
FIG. 6 is a schematic that shows the cross-sectional view of the structure of the second heat sink assembly in accordance with the device disclosed herein.

FIG. 6 illustrates the structure of the second heat sink assembly 1B. The second heat sink assembly 1B is a bottom plate, which has at least two openings 34 on the two sides and a protruding structure 32 of the center of the bottom plate 1B. At least two openings 34 joined with at least two thermal supports 6 in order to fix the first heat sink assembly 1A and he second heat sink assembly 1B. And the openings 34 joined with the thermal supports 6 by the groove 7 on the side of the at least two thermal supports 6 and the blot 36 of the two openings 34.

Furthermore, the protruding structure 32 can be attached to the backside of the printed circuit board 12, therefore, the heat can be transferred from the bottom plate 1B through at least two thermal supports 6, and the second heat dissipating structure 4 to the outside. The advantage of the abovementioned structure is that the heat dissipating space of the backside of the printed circuit board 12 can be increased to improve the heat dissipating efficiency. Moreover, the second heat sink structure 4 can be used for the conventional BGA (ball grid array) package device or TEBGA (thermal enhanced ball grid array) package device without using thermal block 8.

Figure 7:
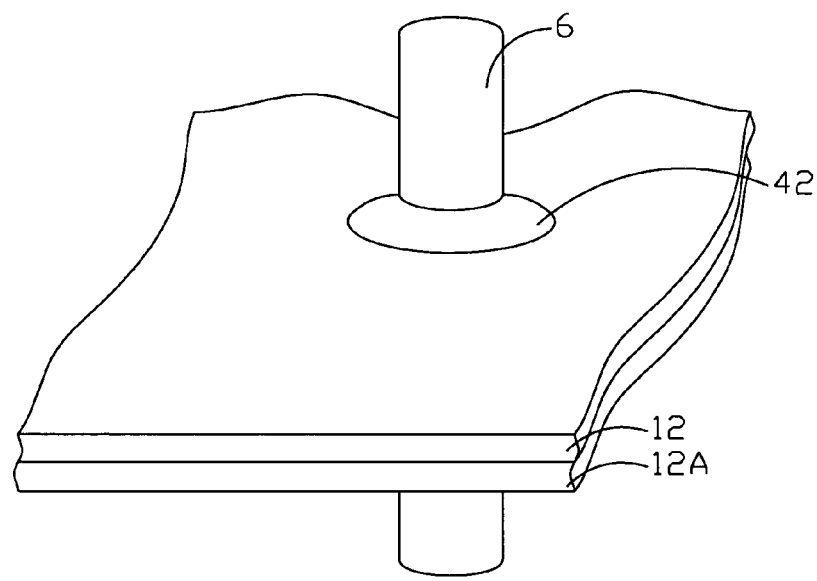
FIG. 7 is a schematic that shows the cross-sectional view of the thermal support of the heat sink body passed through the at least two through holes of the printed circuit board to fix the printed circuit board in accordance with the device disclosed herein.
Figure 8:
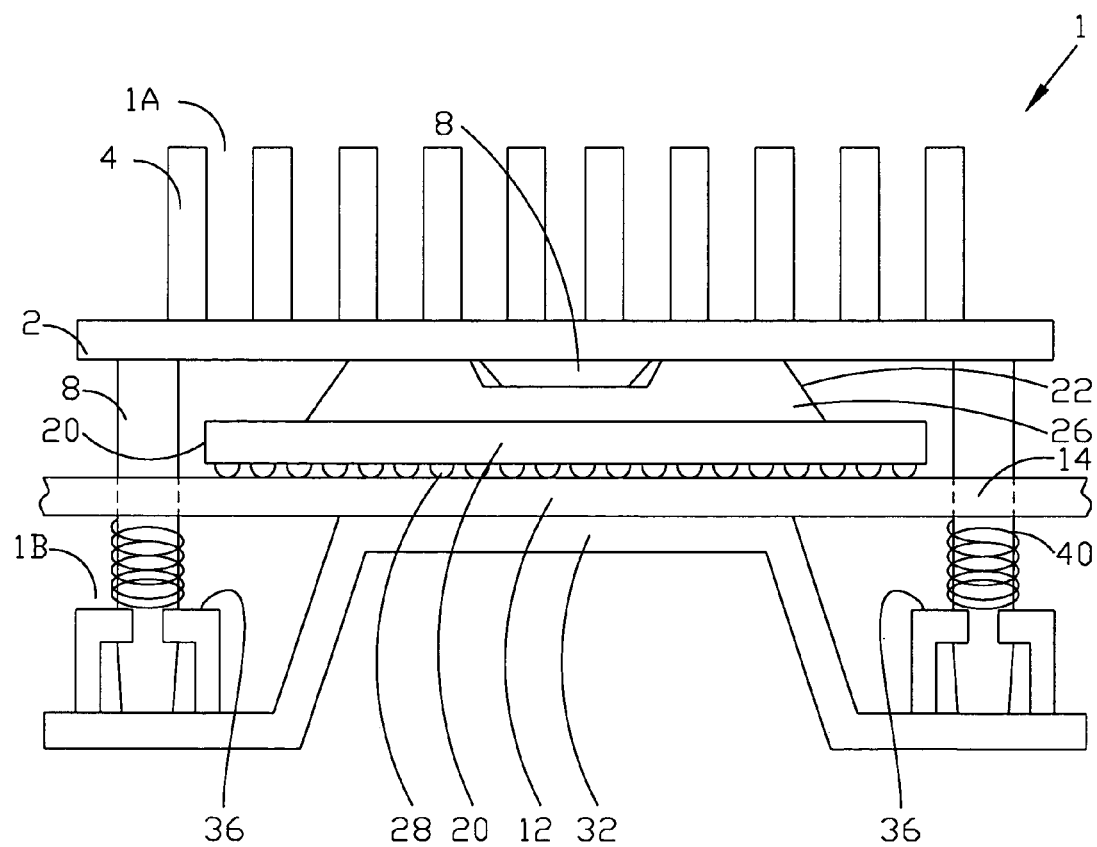
FIG. 8 is a schematic that shows the heat flow path from the printed circuit board to the heat sink assembly in accordance with the structure disclosed herein.

FIG. 7 shows how the first heat dissipating structure 2 is fixed with the printed circuit board 12. The thermal supports 6 of the first heat dissipating structure 2 pass through the holes 14 of the printed circuit board 12 to fix the backside of printed circuit board 12 with first heat dissipating structure 2. In view of the mechanical design, the thermal supports 6 do not contact with the hole-wall of the holes 14, because there is a tolerance between at least two thermal supports 6 and the hole-wall of the hole 14. Nevertheless, the objective of the present invention is to improve the heat dissipating efficiency, thus the tolerance will reduce the heat dissipating efficiency. Therefore, after the thermal supports 6 are passed through the holes 14 of the grounded plane 12A, the gaps space between the hole-wall of holes 14 and the thermal supports 6 are filled with the conductive material 42, and therefore, eliminated.

Therefore, the heat can be removed from the grounded plane 12A of the printed circuit board 12 to the thermal supports 6 by the conductive material 42. And then, the heat is transferred form the thermal supports 6 and through the first heat dissipating structure 2 to the environment. On the other hand, the heat also can be removed from the ball grid array package device through the heat slug 22, the second heat sink assembly 1B, at least two thermal supports 6, and the grounded plane 12A of the printed circuit board 12 to the environment. Moreover, the heat sink assembly also can be used only with at least two thermal supports 6, and at least two springs, but without the bottom plate 1B.

The second heat sink assembly 1B is made of a conductive material or metal, and the second heat sink assembly 1B has the protruding structure 32 attached to the heat slug 22. Therefore, the heat can be transferred to the environment by the second heat sink assembly 1B to improve the heat dissipating efficiency of the package device. Furthermore, the second heat sink assembly 1B further includes at least two springs 40 that put around at least two thermal supports 6 to pull the first heat sink assembly 1A and the second heat sink assembly 1B tight for the heat dissipation between them.

FIG. 8 is cross-sectional view of the construction of the package device with heat sink device 1. The heat is generated by the chip or die during the operation of the computer, thus the heat should be removed to reduce the operating temperature to keep the computer operation stable. The heat can be removed by one heat dissipating path. The heat dissipating path is formed by the heat slug 22, the thermal block 8, first heat dissipating structure 2, and second heat dissipating structure 4. The heat is removed from the chip and transferred through the heat slug 22 of package device to the thermal block 8, first heat dissipating structure 2, and second heat dissipating structure 4 to the environment. There is another heat dissipating path of the package of the present invention. This heat dissipating path is formed by the backside of the printed circuit board 12, the thermal supports 6, the first heat sink assembly 1A and the second heat sink assembly 1B. The heat is removed from the chip and transferred through the backside of the printed circuit board 12, the thermal supports 6, the first heat sink assembly 1A, or transferred down through at least two springs 40, at least two openings 34 of two sides of the second heat sink assembly 1B, and the printed circuit board grounded layer 12A to the environment. There is still another heat dissipating path of the package of the present invention. This heat dissipating path is formed by the backside of the printed circuit board 12 and the protruding structure 32 of the second heat sink assembly 1B. The heat is removed from the chip and transferred through the backside of the printed circuit board 12, the protruding structure 32 of the second heat sink assembly 1B and the printed circuit board grounded plane 12A to the environment.

Although specific embodiments have been illustrated and described, it will be obvious to those skilled in the art that various modifications may be made without departing from what is intended to be limited solely by the appended claims.

What is claimed is:

1. A heat sink device used for ball grid array package device with modified embedded heat slug, comprising:
   a first heat sink assembly having a first heat dissipating structure, and a second heat dissipating structure, said second heat dissipating structure located above said first heat dissipating structure;
   a printed circuit board having a ball grid array package device thereon, said ball grid array package device having an embedded heat slug with a cavity thereon; and
   a second heat sink assembly having a protruding structure in the center of said second heat sink assembly and at least two openings on the two sides of said second heat sink assembly, wherein said first heat sink assembly located above said ball grid array package device of said printed circuit board, and said second heat sink assembly located below said ball grid array package device of said printed circuit board.

2. The heat sink device used for ball grid array package device with modified embedded heat slug according to claim 1, wherein said second heat dissipating structure is a heat dissipating fin.

3. The heat sink device used for ball grid array package device with modified embedded heat slug according to claim 1, wherein a thermal block is located on a backside of said first heat dissipating structure.

4. The heat sink device used for ball grid array package device with modified embedded heat slug according to claim 1, wherein a thermal conductive adhesive tape being located on a backside of said first heat dissipating structure.

5. The heat sink device used for ball grid array package device with modified embedded heat slug according to claim 1, further comprising a thermal material located between said first heat dissipating structure and said ball grid array package device to adhere to said first heat dissipating structure and said ball grid array package device.

6. The heat sink device used for ball grid array package device with modified embedded heat slug according to claim 1, wherein at least said two thermal supports located below said first heat dissipating structure.

7. The heat sink device used for ball grid array package device with modified embedded heat slug according to claim 1, further comprising at least two springs put around at least said two thermal supports.

8. A heat sink device used for package device with modified embedded heat slug, comprising:
   a heat sink assembly having a thermal conductive adhesive tape located on a backside of a first heat dissipating structure, and a second heat dissipating structure located above said first heat dissipating structure;
   a printed circuit board having a package device thereon, wherein said package device having a cavity of an embedded heat slug; and
   a thermal block embedded in said cavity of said package device, wherein said first heat dissipating structure located above said package device of said printed circuit board, and said thermal block within said cavity of said embedded heat slug is attached to said backside of said first heat dissipating structure.

9. The heat sink device used for package device with modified embedded heat slug according to claim 8, wherein said second heat dissipating structure is a heat-dissipating fin.

10. The heat sink device used for package device with modified embedded heat slug according to claim 8, further comprising a thermal material located between said first heat dissipating structure and said package device.

11. The heat sink device used for package device with modified embedded heat slug according to claim 8, further comprising a second heat sink assembly located under said package device of said printed circuit board.

12. The heat sink device used for package device with modified embedded heat slug according to claim 11, wherein said second heat sink assembly having a protruding structure in the center of said second heat sink assembly and at least two openings on the two sides of said second heat sink assembly.

13. A heat sink device of package device, comprising:
   a first heat sink assembly having a first heat dissipating structure, a thermal block located on a backside of said first heat dissipating structure, a second heat dissipating structure located above said first heat dissipating structure, and at least two thermal supports located below said first heat dissipating structure;
   a printed circuit board having a package device thereon and having at least two through holes; and
   a second heat sink assembly having a protruding structure in the center of said second heat sink assembly and at least two openings on the two sides of said second heat sink assembly, wherein said at least two thermal supports of said first heat sink assembly passed through at least said two through holes of said printed circuit board, and jointed with at least said two openings on said two sides of said second heat sink assembly.

14. The heat sink device of said package device according to claim 13, wherein said second heat dissipating structure is a heat-dissipating fin.

15. The heat sink device of said package device according to claim 13, further comprising a conductive material filled with at least said two through holes of said printed circuit board to connect at least said two through hole with said at least said two thermal supports.

16. The heat sink device of said package device according to claim 13, further comprising at least two springs that put around at least said two thermal supports.

* * * * *